(12) United States Patent
Lohmeyer et al.

(10) Patent No.: US 12,009,358 B2
(45) Date of Patent: Jun. 11, 2024

(54) PROTECTIVE CIRCUIT AGAINST ELECTROSTATIC DISCHARGES

(71) Applicant: Robert Bosch GmbH, Stuttgart (DE)

(72) Inventors: Henning Lohmeyer, Reutlingen (DE); Julia Rauh, Sonnenbuehl (DE); Michael Graf, Leutenbach (DE); Timo Seitzinger, Eningen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 804 days.

(21) Appl. No.: 17/051,328

(22) PCT Filed: May 2, 2019

(86) PCT No.: PCT/EP2019/061208
§ 371 (c)(1),
(2) Date: Oct. 28, 2020

(87) PCT Pub. No.: WO2019/211361
PCT Pub. Date: Nov. 7, 2019

(65) Prior Publication Data
US 2021/0242195 A1 Aug. 5, 2021

(30) Foreign Application Priority Data
May 4, 2018 (DE) .......................... 102018206896.8

(51) Int. Cl.
*H02H 9/00* (2006.01)
*H01L 27/02* (2006.01)
*H02H 9/04* (2006.01)

(52) U.S. Cl.
CPC ......... *H01L 27/0292* (2013.01); *H02H 9/044* (2013.01)

(58) Field of Classification Search
None
See application file for complete search history.

(56) References Cited

U.S. PATENT DOCUMENTS 6,512,662 B1 * 1/2003 Wang .................. H01L 27/0251
361/56
9,373,612 B1   6/2016 Huang et al.
(Continued)

FOREIGN PATENT DOCUMENTS

DE  102014102714 A1  9/2015
EP     0490787 A1    6/1992
(Continued)

OTHER PUBLICATIONS

International Search Report for PCT/EP2019/061208, dated Aug. 1, 2019.
(Continued)

*Primary Examiner* — Stephen W Jackson
(74) *Attorney, Agent, or Firm* — NORTON ROSE FULBRIGHT US LLP; Gerard A. Messina

(57) ABSTRACT

A protective circuit against electrostatic discharges for connection pins of an application-specific integrated circuit. The protective circuit includes a first connection pin and a second connection pin, and the first connection pin and the second connection pin being connected to one another in a Y configuration. Moreover, an application-specific integrated circuit including a protective circuit of this type is provided.

14 Claims, 1 Drawing Sheet

(56) References Cited

U.S. PATENT DOCUMENTS

| | | | |
|---|---|---|---|
| 11,418,027 B1* | 8/2022 | Wu | H01L 27/0292 |
| 2006/0018063 A1 | 1/2006 | Boezen et al. | |
| 2009/0262474 A1 | 10/2009 | Farzan et al. | |
| 2010/0061027 A1* | 3/2010 | Jiang | H02H 9/046 |
| | | | 361/56 |
| 2012/0199874 A1 | 8/2012 | Salcedo et al. | |
| 2015/0249078 A1 | 9/2015 | Cao et al. | |
| 2016/0126233 A1 | 5/2016 | Chen et al. | |
| 2016/0336740 A1 | 11/2016 | Parthasarathy et al. | |
| 2020/0021109 A1* | 1/2020 | Li | H02H 9/046 |
| 2021/0183851 A1* | 6/2021 | Davis | H01L 27/0262 |

FOREIGN PATENT DOCUMENTS

| | | |
|---|---|---|
| EP | 2246885 A1 | 11/2010 |
| JP | H0494161 A | 3/1992 |
| JP | 2007173793 A | 7/2007 |
| JP | 2008288236 A | 11/2008 |
| WO | 2004049442 A1 | 6/2004 |

OTHER PUBLICATIONS

Yang Xiu et al., "Case Study of DPI Robustness of a MOS-SCR Structure for Automotive Applications," Institute of Electrical and Electronics Engineers (IEEE), 2016, pp. 1-6.

* cited by examiner

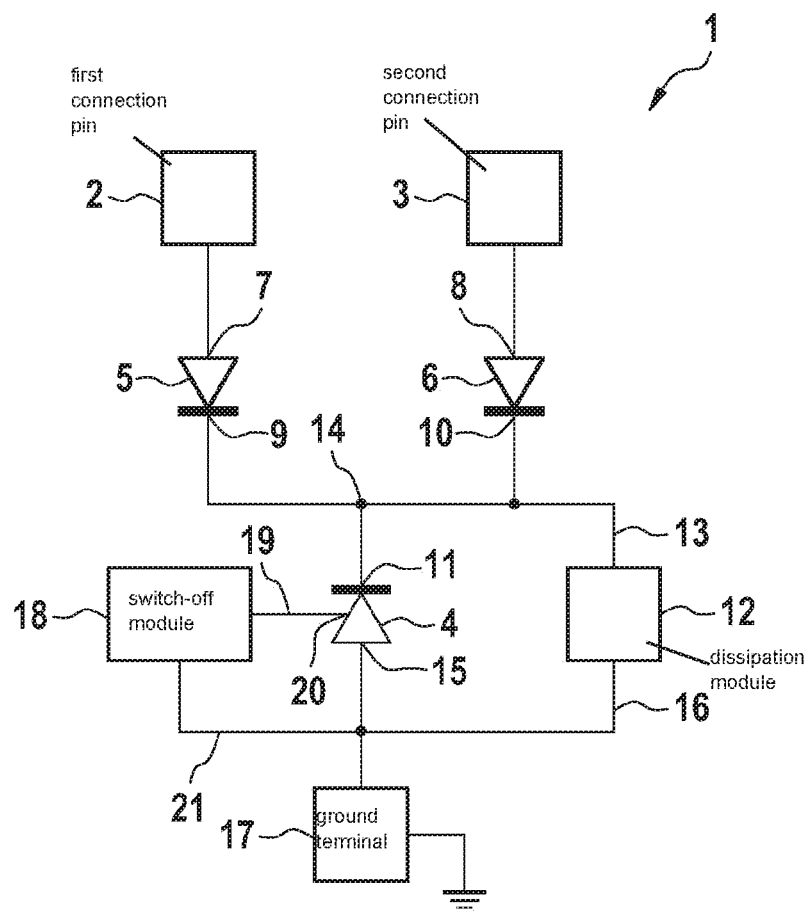

PROTECTIVE CIRCUIT AGAINST ELECTROSTATIC DISCHARGES

FIELD

The present invention relates to a protective circuit against electrostatic discharges for connection pins of an application-specific integrated circuit, the protective circuit including a first connection pin and a second connection pin.

Moreover, the present invention relates to an application-specific integrated circuit including the protective circuit.

BACKGROUND INFORMATION

The protection against electrostatic discharges, which is also referred to as ESD protection (ESD=electrostatic discharge), of semiconductor components generally utilizes technology-specific components, which are adapted to the ESD requirements with respect to dynamics and power. The type of the ESD protection does not play a role at this point. Interface connection pins, which are also referred to as interface pins, as is the case, for example, with the controller area network (CAN) interface, generally utilize separate ESD protective structures for each connection pin. These are each usually made up of two protective structures against positive and negative stress, which are connected in series. There are also circuit concepts, in the case of which the protective structures are situated in parallel or are even more complex, but these are considerably less favorable for the application due to a utilization of an even greater area.

Such protective structures are described in "Case Study of DPI Robustness of a MOS-SCR Structure for Automotive Applications," Yang Xiu et al., Proc. EOS/ESD Symp., 2016, and the Bosch semiconductor chip CY327.

The complex requirements on connection pins, in particular system connection pins, such as CAN or low voltage differential signaling (LVDS), require very specific ESD protective structures, without the function being interfered with in a significant way. Conventional ESD protective circuits also require a relatively large area, which may increase the costs per unit. In addition, a robustness against interfering pulses, in particular multiple pulse loads, may often be implementable only with the aid of a relatively great deal of effort. Occasionally it is a problem that the protective circuit responds not only to ESD effects, but even to normal functional pulses.

SUMMARY

According to an example embodiment of the present invention, a protective circuit against electrostatic discharges for connection pins of an application-specific integrated circuit is provided, the protective circuit including a first connection pin and a second connection pin, the first connection pin and the second connection pin being connected to one another in a Y configuration.

The example protective circuit according to the present invention may have the advantage that electronic protective structures may be jointly utilized by the first connection pin and the second connection pin. In this way, a reduction in area is possible. In this way, a symmetrical signal, in particular in the case of CAN applications or LVDS applications, may also be achieved.

Advantageous refinements of the present invention are described herein.

In accordance with an example embodiment of the present invention, the protective circuit includes a first connection pin and a second connection pin. The protective circuit therefore encompasses multiple, namely at least two, connection pins. In some specific embodiments, however, the protective circuit includes three or more connection pins, of which two or more are connected to one another in a Y configuration. Preferably, two or more connection pins of the protective circuit are electrically connected to a shared central node of the protective circuit.

Some specific embodiments of the present invention provide that the protective circuit encompasses a shared electronic protective structure against positive stress for the first connection pin and for the second connection pin. In specific embodiments including three or more connection pins, the protective circuit may encompass the shared electronic protective structure against positive stress for two or more connection pins, preferably for all connection pins. This arrangement represents a space-related advantage, since electronic components may be saved.

In one particular specific embodiment of the present invention, it is provided that the protective circuit encompasses multiple electronic protective structures against a polarity reversal of the first connection pin and the second connection pin. In this way, preferably the first connection pin and the second connection pin may each be protected against polarity reversal by separate electronic protective structures. This also has the advantage that different pins having different polarity-reversal requirements may be operated very specifically and in a function- and area-optimized manner. In specific embodiments encompassing three or more connection pins, the protective circuit for each connection pin may include a separate electronic protective structure against polarity reversal.

According to one preferred specific embodiment of the present invention, it is provided that the electronic protective structures against polarity reversal and the electronic protective structure against positive stress are connected to one another in a Y configuration. Due to the coupling between the electronic protective structures, the first connection pin and the second connection pin become symmetrical, in particular in the range of positive operating voltages. Leakage current behavior, capacitance, and preload are then identical at the first connection pin and at the second connection pin. Since, for example, in CAN applications, a difference signal of the first connection pin and of the second connection pin may be utilized as information, this arrangement is superior to the separate protective structures. In the separate case, shifts of both signals may occur in the time range, so that the difference signal may not be unambiguously detected.

Some specific embodiments of the present invention provide that the protective circuit encompasses a first N-type silicon controlled rectifier and a second N-type silicon controlled rectifier as electronic protective structures against polarity reversal, the first N-type silicon controlled rectifier being connected upstream from the first connection pin and the second N-type silicon controlled rectifier being connected upstream from the second connection pin. Such silicon controlled rectifiers are also referred to and, in the following, abbreviated as NSCR (NMOS triggered silicon controlled rectifier). The first NSCR and the second NSCR each include a cathode, a gate terminal, which is also referred to as a control terminal, and an anode. NSCRs are widespread, inexpensively available, and proven. In this way, a reliable protective circuit may be achieved. This approach applies not only for SCR protective structures, but may also be expanded to any other protective structures, such as bipolar transistors, diodes, active clamps, or other elements.

In some specific embodiments of the present invention, the protective circuit encompasses a P-type silicon controlled rectifier as a shared electronic protective structure against positive stress, which is connected upstream from the first connection pin as well as from the second connection pin. Such silicon controlled rectifiers are also referred to and, in the following, abbreviated as PSCR (PMOS triggered silicon controlled rectifier). The PSCR includes a cathode, a gate terminal, which is also referred to as a control terminal, and an anode. PSCRs are widespread, inexpensively available, and proven. In this way, a reliable protective circuit may be achieved. This approach applies not only for SCR protective structures, but may also be expanded to any other protective structures, such as bipolar transistors, diodes, active clamps, or other elements. It is preferred when the P-type silicon controlled rectifier is connected upstream from all connection pins in protective circuits encompassing three or more connection pins.

It is preferred when the P-type silicon controlled rectifier is connected upstream from the first N-type silicon controlled rectifier and the second N-type silicon controlled rectifier. In this way, an effective protective circuit encompassing a reduced number of electrical components may be achieved, in the case of which the first connection pin and the second connection pin are connected to one another in a Y configuration. It is preferred when the P-type silicon controlled rectifier is connected upstream from the particular N-type silicon controlled rectifier in protective circuits encompassing three or more connection pins.

Some specific embodiments of the protective circuit in accordance with the present invention encompass a dissipation module. The dissipation module may be situated in the circuit for a prompt discharge of high-resistance nodes. In this way, a complete potential equalization may advantageously take place within the integrated circuit before a possible subsequent pulse. It is preferred when the central node discharges between the protective structures. If a dissipation module is provided for the discharge with respect to multiple pulses, a reduction of the voltage requirement on the utilized components of the useful circuit is made possible. This also represents the possibility of an area reduction.

In some specific embodiments of the present invention, the dissipation module is connected in parallel to the P-type silicon controlled rectifier. The dissipation module is therefore preferably electrically connected via a first terminal of the dissipation module to the cathode of the PSCR and via a second terminal of the dissipation module to the anode of the PSCR. A preferred dissipation module encompasses a resistor. Particularly preferred dissipation modules contain a circuit having a variable resistance during operation. The parallel circuit makes it possible to implement a simple and reliable dissipation.

Specific embodiments of the present invention provide that the protective circuit encompasses a switch-off module. In some specific embodiments of the present invention, the protective circuit is configured in such a way that the ESD protection is dynamically switched on via rapid pulse edges. In that case, it is advantageous when the ESD protection is completely switched off or is modified, during operation, in such a way that it does not respond to "normal" functional pulses and, therefore, disrupts the normal function of the connection pin or of the application-specific integrated circuit (ASIC). Namely, it is entirely possible that pulses including edges, which have slopes similar to those of ESD pulses, in particular a slope between 0.1 V/ns to 10 V/ns, occur during normal operation as well. Some specific embodiments provide that the switch-off module is configured for a variable switch-off. The variable switch-off weakens the ESD protection, but does not completely switch off the ESD protection, since electrostatic discharges are also possible during operation. In this way, the protective circuit also remains active, in a weakened form, during operation of the application-specific integrated circuit. The switch-off module makes it possible to utilize dynamic protective structures (SCR) for ESD also in the case of circuits, which process extremely rapid signals.

In some specific embodiments of the present invention, the switch-off module is situated in such a way that it is utilized for one or multiple negative protective element(s) of the protective circuit, preferably the N-type silicon controlled rectifier, which are negative protective elements. In this case, it is possible that a shared switch-off module is provided for all negative protective elements. Alternatively, each negative protective element is able to switch off with the aid of a separate switch-off module. In this case, a separate switch-off module is provided for each negative protective element. Some specific embodiments provide that a switch-off module is electrically connected, in each case, to the gate terminal of an appropriate negative protective element, in particular of the N-type silicon controlled rectifier.

Preferably, the switch-off module is electrically connected to the gate terminal of the P-type silicon controlled rectifier. It is preferred when the switch-off module is electrically connected to the gate terminal of the P-type silicon controlled rectifier via a connecting terminal of the switch-off module, and when the switch-off module is electrically connected to the anode of the P-type silicon controlled rectifier via a further connecting terminal of the switch-off module. One preferred switch-off module is a MOS switch, which grounds the PSCR during operation. For this reason, it is preferred when the switch-off module is also electrically connected to a ground terminal via the further connecting terminal. Alternatively to a MOS switch, other switch types are provided in other specific embodiments. The switch may reliably switch off the PSCR via the gate terminal. Some specific embodiments encompass switch-off modules for each negative protective element of each connection pin and, additionally, a switch-off module for the P-type silicon controlled rectifier.

In some specific embodiments of the present invention, the ground terminal is connected upstream from the P-type silicon controlled rectifier (PSCR). Preferably, the anode of the PSCR is electrically connected to the ground terminal.

Moreover, according to the present invention, an application-specific integrated circuit including an above-described protective circuit is provided, in the case of which the first connection pin and the second connection pin are connected to one another in a Y configuration.

The above-described advantages and possible embodiments of the protective circuit similarly apply for the application-specific integrated circuit (ASIC).

Preferably, the application-specific integrated circuit includes a CAN interface or an LVDS interface. In specific embodiments of the present invention, the first connection pin is a CANH connection pin. In specific embodiments of the present invention, the second connection pin is a CANL connection pin. In other specific embodiments, the first connection pin and the second connection pin are other low voltage differential signal (LVDS) interfaces. In specific embodiments of the present invention, the first connection pin and the second connection pin may be any type of ASIC system connection pin or interface connection pin, in particular connection pins of differential ASIC interfaces. The general application for HV-ASIC connection pins is also possible.

BRIEF DESCRIPTION OF THE DRAWING

One exemplary embodiment of the present invention is explained in greater detail with reference to the FIGURE and the description below.

FIG. 1 shows one exemplary embodiment of a protective circuit according to the present invention, which is contained in an application-specific integrated circuit.

DETAILED DESCRIPTION OF EXAMPLE EMBODIMENTS

A protective circuit 1 according to an example embodiment of the present invention, which is contained in an application-specific integrated circuit, is shown in FIG. 1.

Exemplary protective circuit 1 includes a first connection pin 2 and a second connection pin 3. Protective circuit 1 is therefore a protective circuit 1 against electrostatic discharges for connection pins 2, 3 of the application-specific integrated circuit. Protective circuit 1 is exemplary for a CAN application, i.e., a basic example. The present invention is not limited to use in a CAN application, however. In the exemplary embodiment shown, first connection pin 2 is a CANH connection pin. In the exemplary embodiment shown, second connection pin 3 is a CANL connection pin. There are specific embodiments (not shown, for the sake of simplicity), however, in particular for applications other than CAN applications, which include more than two connection pins 2, 3.

As described in the following, first connection pin 2 and second connection pin 3 are connected to one another in a Y configuration in the exemplary embodiment shown.

Protective circuit 1 encompasses a shared electronic protective structure against positive stress for first connection pin 2 and for second connection pin 3. More precisely, protective circuit 1 encompasses a P-type silicon controlled rectifier, PSCR 4, as a shared electronic protective structure against positive stress, which is connected upstream from first connection pin 2 as well as from second connection pin 3.

Moreover, protective circuit 1 encompasses multiple electronic protective structures against polarity reversal of first connection pin 2 and of second connection pin 3. More precisely, protective circuit 1 encompasses a first N-type silicon controlled rectifier, a first NSCR 5, and a second N-type silicon controlled rectifier, second NSCR 6, as electronic protective structures against polarity reversal. First NSCR 5 is connected upstream from connection pin 2 and second NSCR 6 is connected upstream from second connection pin 3. First connection pin 2 is electrically connected directly, i.e., without an interconnection of further components, to an anode 7 of first NSCR 5. Second connection pin 3 is electrically connected directly to an anode 8 of second NSCR 6.

A cathode 9 of first NSCR 5 is electrically connected directly to a cathode 10 of second NSCR 6. A cathode 11 of PSCR 4 is electrically connected directly to cathode 9 of first NSCR 5 as well as directly to cathode 10 of second NSCR 6. PSCR 4 is therefore connected upstream from first NSCR 5 and from second NSCR 6. In other words, first NSCR 5 is connected between first connection pin 2 and PSCR 4, and second NSCR 6 is connected between second connection pin 3 and PSCR 4. In this way, the two electronic protective structures against polarity reversal and the shared electronic protective structure against positive stress are connected to one another in a Y configuration. First connection pin 2 and second connection pin 3 form two ends of the Y configuration, while a third end of the Y configuration is formed by PSCR 4.

The advantage of the Y configuration is that a symmetrical signal for first connection pin 2 and second connection pin 3 is achievable in the CAN application or, in other exemplary embodiments, in other LVDS interfaces. A reduction in area is also achievable, since the positive protection is utilized only once in the exemplary embodiment shown.

Moreover, protective circuit 1 includes a dissipation module 12, in the present case a resistor. Dissipation module 12 is electrically directly connected, with the aid of a first terminal of the dissipation module via a first conductor 13, to cathode 9 of first NSCR 5, cathode 10 of second NSCR 6, and cathode 11 of PSCR 4 in a central node 14. Dissipation module 12 is directly connected, with the aid of a second terminal of dissipation module 12, to an anode 15 of PSCR 4 via a second conductor 16. Dissipation module 12 is therefore connected in parallel to PSCR 4. Via second conductor 16, dissipation module 12 is also electrically connected directly to a ground terminal 17 (also referred to as GND or ground). This means ground terminal 17 is also connected upstream from PSCR 4, more precisely, anode 15 of PSCR 4, is electrically connected directly to ground terminal 17.

Moreover, protective circuit 1 encompasses a switch-off module 18. Switch-off module 18 is a MOS switch, which activates PSCR 4 during the "grounded" operation, i.e., the electrical connection between anode 15 and ground terminal 17. Switch-off module 18 is electrically connected directly to a gate terminal 20 of PSCR 4 via a first connection 19. Switch-off module 18 is electrically connected directly to anode 15 of PSCR 4 via a second connection 21. In addition, switch-off module 18 is electrically connected directly via second connection 21 to ground terminal 17 as well as to second side 16 of dissipation module 12.

Switch-off module 18 and dissipation module 12 are usable not only for the CANH connection pin and the CANL connection pin, but also for all other system connection pins. The concept of the Y configuration is independent of the type of utilized ESD protective structures.

In the exemplary embodiment shown in FIG. 1, direct connections between two components of protective circuit 1 are in fact frequently described. In specific embodiments (not shown), however, even further components may be provided in protective circuit 1 between the two components, which are electrically connected to one another, instead of such a direct connection, without the mode of operation of protective circuit 1 changing as a result.

In specific embodiments (not shown), protective circuit 1 encompasses three or more connection pins 2, 3. Protective circuit 1 is therefore not limited, in principle, to first connection pin 2 and second connection pin 3. Preferably, a separate negative protective element, preferably an NSCR 5, 6, is then connected upstream from each connection pin 2, 3, as in FIG. 1 as well. Preferably, shared PSCR 4 is connected upstream from each NSCR 5, 6 of each connection pin 2, 3, as in FIG. 1 as well. It is preferred, regardless of the number of connection pins 2, 3, when each NSCR 5, 6 of each connection pin 2, 3 is directly connected to central node 14 with the aid of cathode 9, 10 of NSCR 5, 6, respectively, as also shown in FIG. 1. In specific embodiments (not shown), one further switch-off module 18 is also electrically connected to a gate terminal of one or multiple negative protective element(s). Preferably, one further switch-off module 18 is provided for each negative protective element of each connection pin 2, 3.

As an advantage of the overall system, an integrated approach is achievable including a considerably reduced area, which results in cost savings, and robustness against any type of interfering pulses, which allows for further possible applications.

What is claimed is:

1. A protective circuit configured to protect against electrostatic discharges for connection pins of an application-specific integrated circuit, the protective circuit comprising:
   a first connection pin; and
   a second connection pin;
   wherein the first connection pin and the second connection pin are connected to one another in a Y configuration such that the first connection pin and the second connection pin are electrically connected to a shared central node of the protective circuit.

2. The protective circuit as recited in claim 1, further comprising:
   a shared electronic protective structure configured to protect against positive stress for the first connection pin and for the second connection pin.

3. The protective circuit as recited in claim 2, further comprising:
   multiple electronic protective structures configured to protect against polarity reversal of the first connection pin and of the second connection pin.

4. The protective circuit as recited in claim 3, wherein the electronic protective structures configured to protect against polarity reversal and the electronic protective structure configured to protect against positive stress are connected to one another in a Y configuration.

5. A protective circuit configured to protect against electrostatic discharges for connection pins of an application-specific integrated circuit, the protective circuit comprising:
   a first connection pin;
   a second connection pin, wherein the first connection pin and the second connection pin are connected to one another in a Y configuration;
   a shared electronic protective structure configured to protect against positive stress for the first connection pin and for the second connection pin; and
   multiple electronic protective structures configured to protect against polarity reversal of the first connection pin and of the second connection pin,
   wherein the protective circuit includes a first N-type silicon controlled rectifier and a second N-type silicon controlled rectifier as the electronic protective structures configured to protect against polarity reversal, the first N-type silicon controlled rectifier being connected upstream from the first connection pin and the second N-type silicon controlled rectifier being connected upstream from the second connection pin.

6. The protective circuit as recited in claim 5, wherein the protective circuit includes a P-type silicon controlled rectifier as the shared electronic protective structure configured to protect against positive stress, which is connected upstream from the first connection pin and upstream the second connection pin.

7. The protective circuit as recited in claim 6, wherein the P-type silicon controlled rectifier is connected upstream from the first N-type silicon controlled rectifier and the second N-type silicon controlled rectifier.

8. The protective circuit as recited in claim 6, further comprising:
   a dissipation module.

9. The protective circuit as recited in claim 8, wherein the dissipation module is connected in parallel to the P-type silicon controlled rectifier.

10. The protective circuit as recited in claim 6, further comprising:
    a switch-off module.

11. The protective circuit as recited in claim 10, wherein the switch-off module is electrically connected to a gate terminal of the P-type silicon controlled rectifier.

12. The protective circuit as recited in claim 6, wherein a ground terminal is connected upstream from the P-type silicon controlled rectifier.

13. An application-specific integrated circuit, comprising:
    a protective circuit protective circuit configured to protect against electrostatic discharges for connection pins of the application-specific integrated circuit, the protective circuit including:
    a first connection pin, and
    a second connection pin,
    wherein the first connection pin and the second connection pin are connected to one another in a Y configuration such that the first connection pin and the second connection pin are electrically connected to a shared central node of the protective circuit.

14. The application-specific integrated circuit as recited in claim 13, wherein the application-specific integrated circuit encompasses a CAN interface or an LVDS interface.

\* \* \* \* \*